United States Patent [19]

Colla

[11] 4,300,184

[45] Nov. 10, 1981

[54] CONFORMAL COATING FOR ELECTRICAL CIRCUIT ASSEMBLIES

[75] Inventor: Jeannine O. Colla, Whitefish Bay, Wis.

[73] Assignee: Johnson Controls, Inc., Milwaukee, Wis.

[21] Appl. No.: 56,505

[22] Filed: Jul. 11, 1979

[51] Int. Cl.[3] ............................................. H05K 3/28
[52] U.S. Cl. .............................. 361/397; 174/52 PE
[58] Field of Search .................... 361/397; 174/52 PE

[56] References Cited

U.S. PATENT DOCUMENTS

| | | | |
|---|---|---|---|
| 3,484,536 | 12/1969 | Jaeschke | 174/52 PE |
| 3,652,333 | 3/1972 | Warren | 174/52 PE |
| 3,653,959 | 4/1972 | Kehr | 174/52 PE |
| 3,669,733 | 6/1972 | Allington | 174/52 PE |

FOREIGN PATENT DOCUMENTS 853941  11/1960  United Kingdom ........... 174/52 PE

*Primary Examiner*—Richard R. Kucia

*Attorney, Agent, or Firm*—Andrus, Sceales, Starke & Sawall

[57] ABSTRACT

A printed circuit board with electronic components wired thereto has a conformal insulating coating consisting of a single component of essentially pure urethane formulation and a minor amount of fumed colloidal silica powder. The insulating coating covers asperities and protrusions as well as the conductors and circuit components while maintaining a transparent characteristic. The coating material is made by mixing of the small proportion of silica with essentially pure urethane formulation under controlled conditions to prevent moisture contamination of the materials. The mixture is thoroughly mixed, deaerated under reduced pressure with a pulsating pressure to break any air bubbles and remove essentially all air. The coating is applied in an environment having at least 30 percent relative humidity and within a confined area defined by an encircling dam masking compound. The coating is allowed to partially cure at room temperature and the confining dam compound removed. For maximum protection, a further period of curing of one week is provided.

6 Claims, 4 Drawing Figures

CONFORMAL COATING FOR ELECTRICAL CIRCUIT ASSEMBLIES

BACKGROUND OF THE INVENTION

This invention relates to a light transmitting protective coating for electrical circuit assemblies.

Electrical circuits are conventionally mounted on a suitable circuit board or other support means having an appropriate electrical characteristic such as the necessary dielectric strength, power factor, insulating characteristic, and the like. The supporting structure must also have the necessary physical properties for a given application, such as tensile strength, tear resistance, and the like. In addition, in many instances the environmental useage must be considered in the design, construction and manufacture of electrical circuit systems. In particular, the humidity and/or temperature of the environment within which the electrical circuit must operate may have substantial significance in the design. In many environments, the circuit specification requires a protective enclosure such as a suitable coating, encapsulation, and the like. Both the electrical and physical characteristics of the enclosure must, of course, be considered in relationship to the environmental conditions to be encountered including rather extreme variations in the conditions in many instances. A coating which has the ability to transmit light from the exterior into the electrical circuit would be extremely useful. If repair or replacement is required, the coating can be removed and, after necessary maintenance, replaced. Thus, the coating permits visual inspection or review of the circuit as well as correction and revision of the circuit. If an opaque covering is used having the necessary electrical and other physical characteristics, the failure to transmit light may make it exceedingly difficult to maintain the covered circuit. One example in which the light transmission characteristic of the covering is significant is a badge reader for limiting of access to buildings or other controlled areas. Such device is necessarily generally mounted in the outside environment and subject to various changes in the environment including rain, snow, environmentally-borne salt and the like. The control circuit is advantageously sealed to protect the instrument against the environmental conditions. Generally such applications have required complete encapsulation within a suitable resin. A suitable protective resin which can be used as a sealant and/or as a conformal coating for environmental usage in varying temperature and humidity conditions, has not been found with both the desired light transmitting characteristic as well as all of the necessary electrical and physical characteristics required for effective and long life protection. Thus, the most carefully manufactured and trimmed systems generally have protrusions and asperities greater than 0.5 mil in height. Although materials such as urethane formulation has been suggested for many circuit applications because of its satisfactory electrical and physical properties, the material has not been found by the inventor to provide an effective coating of circuit boards with even such minute protrusions and asperities.

There is therefore no readily available coating material known to the present inventor which can be used as a circuit coating to effectively cover interconnecting projecting pin-like circuit elements which generally remain at least partially exposed with the use of a known coating. In such instances, the circuit is therefore embedded in a potting material to maintain the relatively minute protrusions and asperities completely encapsulated.

SUMMARY OF THE PRESENT INVENTION

The present invention is directed to a conformal coating for an electrical circuit and particularly a coating having light transmitting properties as well as the necessary electrical and physical characteristics to permit usage in an environment having various temperature and humidity characteristics.

Generally, in accordance with the present invention, the conformal coating is essentially a mixture of a transparent electrical insulating and impervious liquid and a small amount of a thickening powder. Generally the inventor has found that urethane resin and a small quantity of a fumed colloidal silica additive produces a highly satisfactory conformal coating. The coating material of the present invention has excellent adhesive qualities such that it will effectively attach to pointed protrusions from a circuit board. The coating material also has excellent physical properties, such as high tensile strength and corrosion resistance as well as having the necessary dielectric strength, power factor, insulating characteristic and the like. The final coating drys as a smooth finish with a high degree of transparency for visual inspection of the coated circuit boards and the associated components as well as permitting direct repair by the simple use of a soldering iron for access to the components and their interconnections. A repaired or modified circuit board can also be readily overcoated employing the unique coating of this invention.

The coating may therefore be directly applied as a relatively thin coat because of its good conforming characteristics to effectively encapsulate and cover the circuit connections including the solder and circuit terminal projections and the like, as well as the various circuit components and conductors. This is of substantial significance for application in high humidity environmental conditions in which the moisture would tend to subject the circuit to bridging or shorting between any such exposed projections.

The coating provides a highly effective sealing of the circuit components and their connection, thereby essentially eliminating the corrosion or shorting normally associated with environmental borne water vapor. The necessary electrical properties are such as to permit usage in circuit board applications ranging from the conventional power frequencies to the microwave frequency range.

More particularly, in a unique and highly practical implementation and embodiment of the present invention, the conformal coating includes a single component of essentially pure urethane formulation which is a liquid urethane polymer in a solvent formulation and which has been used as noted above because of the desired physical and electrical characteristics as well as a relatively low viscosity, to create a transparent coating.

The present inventor has discovered that when such urethane formulation is essentially free of moisture and mixed with a suitable fumed silica an unexpectedly satisfactory conformal coating is acquired which covers all significant asperities and protrusions, while maintaining the highly desirable transparent or light transmitting characteristics. The materials must, however, be appropriately and carefully processed to prevent introduction of moisture during the formation. The material is otherwise readily applied on a production line basis as well as on a limited repair basis. The conformal coating consists of a relatively small proportion of silica and a balance of essentially pure urethane formulation. For example, five parts of fumed colloidal silica powder added to 40 parts of essentially pure urethane formulation provides a highly effective mixture. The mixture is thoroughly mixed and then immediately deaerated under reduced pressure for a sufficient period to break any air bubbles within the coating formulation and thereby removing essentially all air. The mixed coating is maintained in a protective enclosed atmosphere to prevent contamination, particularly from moisture. The coating is applied however in an atmosphere having a humidity of at least 30 percent relative humidity. The conformal coating may be poured or otherwise applied onto an area of the circuit board which may be defined by a suitable confining means such as a flexible masking compound. A spatula or other tool distributes and guides the high viscosity formulation within the defined outlined area. The coating is then allowed to set or partially cure to permit removal of the masking compound, thereby finishing the circuit board protection. Ultimate protection from adverse environmental condition, however, requires an extended period of curing. The compounded urethane formulation and fumed silica thickening agent produces an unusually effective conformal coating for circuit boards and the like where small asperities and projections are encountered, and particularly where light transmission is desirable such as visual viewing.

The present invention thus provides a transparent coating which can be applied to printed circuit systems and the like wherein small asperities and projections must be coated.

BRIEF DESCRIPTION OF THE DRAWINGS

The drawings illustrate the best mode presently contemplated of carrrying out the invention.

In the drawings.

DESCRIPTION OF THE ILLUSTRATED EMBODIMENT

Figure 1:
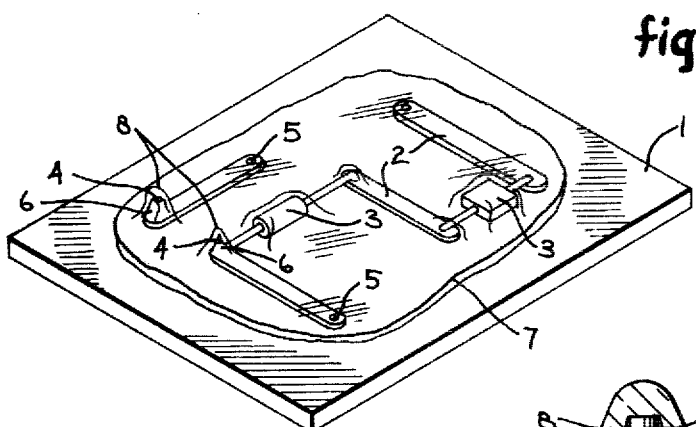
FIG. 1 is a pictorial view of a circuit board with a conformal coating applied.
Figure 2:
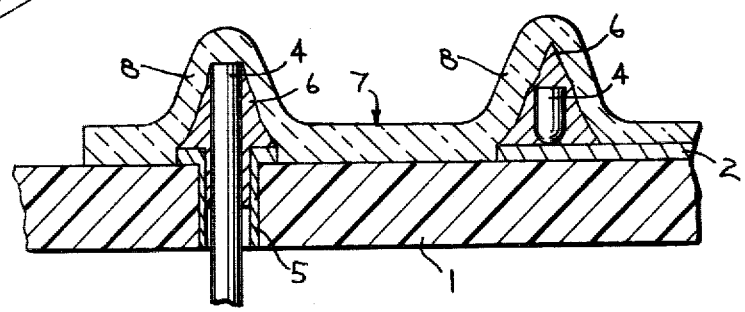
FIG. 2 is an enlarged vertical section through a portion of the circuit board shown in FIG. 1.
Figure 3:
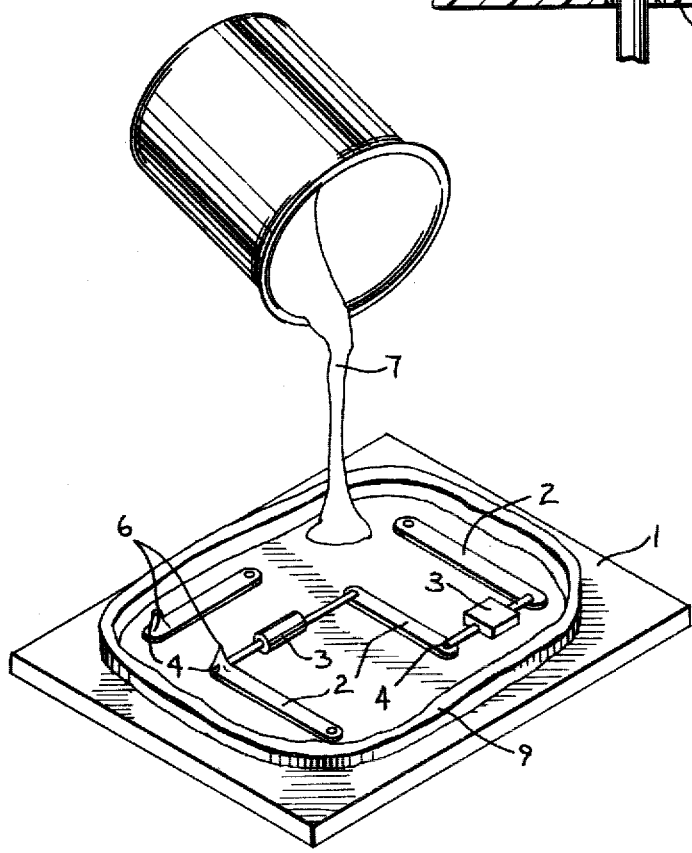
FIG. 3 is a pictorial view showing one step in the application of a coating to a circuit board such as in FIG. 1.

Referring to the drawings and particularly to FIGS. 1 and 2, a printed circuit board assembly is illustrated including a supporting base or a substrate 1 upon which a conductive pattern of highly conductive material is attached to define interconnecting circuit conductors 2. Various electrical components 3 such as resistors, transistors, and the like are mounted to the board 1 and connected to the conductors 2. The components 3 thus have terminals 4 which may pass through suitable board openings 5 with suitable electrical soldered connections 6. A conformal coating 7 is applied over the circuit board and particularly the soldered connections 6 and terminals 4. The soldered connections 6 as well as the terminals 4 define sharp projections or asperities which extend outwardly of the board 1 and components 3. As most clearly illustrated in the simplified cross-sectional view of FIG. 2, the coating 7 is shown intimately adhering to the covered surfaces of board 1 and conductors 2, including all asperities and projections as at 8, to maintain the complete effective enclosure and sealing of the circuit. Coating 7 is, however, transparent and relatively thin, permitting both visual study of the circuit as well as convenient cutting and/or removal of the coating for access to the circuit for service, maintenance, reconstruction or the like. The coating is particularly formed in accordance with the present invention as a mixture of predominantly nonviscous transparent insulating liquid and a separate and a minor amount of fine, dust-like thickening powder. The insulating material is a nonviscous material which flows readily and produces a free flow film which is relatively thin such as thickness on the order of 0.5 mil, and is transparent to permit visual study of the coated undersurface. A relatively thin coating of proper electrical and physical characteristic is of course desirable for ease of service, minimizing costs and the like. The precise thickness of the coating will vary slightly with the particular base material and thickening material employed. The descriptive terminology of this conformal coating is used herein to define a coating or covering which has a thickness on the order of less than 2.0 mils on the outermost projections of a covered unit. The fine dust-like thickening powder changes the characteristic sufficiently to allow attachment of the coating to a pointed surface without destroying the transparency or the other electrical and physical properties of the insulating material.

A particularly unique formulation consists of a fumed silica powder and an essentially pure urethane liquid as the insulating base medium. A particularly satisfactory urethane formulation is that manufactured and sold by the Furane Plastic, Inc. (a subsidiary of M & T Chemicals, Inc.) of 5121 San Fernando Road, West, Los Angeles, California 90039. The urethane formulation is sold under the trade name of "Uralane 8267". A particularly satisfactory material is "Uralane 8267" which is a one component transparent urethane coating material developed for application to circuit boards and electronic circuitry. The material is a single component formulation which can be applied by spraying or brush techniques to most electronic circuitry. By itself, the urethane formulation provides a coating of approximately 0.5 mil and flows freely downwardly along and around a member to a more or less constant level. The material is transparent and has the advantage of allowing ready circuit repair by soldering, iron cutting, or any suitable hot instrument cutting techniques, or the like. Generally in many applications the asperities and projections such as created by terminals 4, a soldered connection 6 or the like are in excess of 0.5 mil. A coating of urethane formulation does not fully cover or enclose such elements. In accordance with the teaching of the present invention the essentially pure urethane formulation is mixed with a small amount of the thickening agent. A fire dryed fumed colloidal silica of exceptional purity provides a particularly satisfactory formulation. Applicant has discovered that the addition of the thickening agent in small quantities maintains all of the physical and electrical characteristics of urethane while providing a significant change in the covering characteristic of the coating to maintain the desired complete covering of the circuit including surface projections in excess of 0.5 mil without interfering with the highly desired transparency characteristic for the cover circuit. Generally a fire-dryed fumed silica of a high degree of fineness is employed, with the formulation created in such a manner so as to essentially prevent any introduction of moisture into the coating material. Generally, the fumed silica should have a very high degree of purity, and preferably a purity on the order of at least 99.5 percent. The silica must be powdered and essentially of submicron sized particles. A particularly satisfactory fumed colloidal silica is manufactured and sold by Cabot Corporation, 125 High Street, Boston, Massachusetts 02110, under the trade name "Cab-O-Sil" Grade M-5 fumed colloidal silica. The powdered silica is sold in a vacuum-sealed bag to maintain the material essentially free of all moisture and with a particle size on the order as fine as cigarette smoke, resulting in coverage of a normal surface area generally on the order of 200 square meters per gram. As noted previously, the silica has essentially no water content. Fumed silica is the single additive which the inventor has discovered that provides both good water resistance and high thickening efficiency at the same time. The inventor has discovered that these properties uniquely contribute to creating a stable conformal coating which can be stored, handled and properly processed under appropriate care. Further, the conformal coating can be frozen to extend the life of the prepared formulation of urethane and silica.

Figure 4:
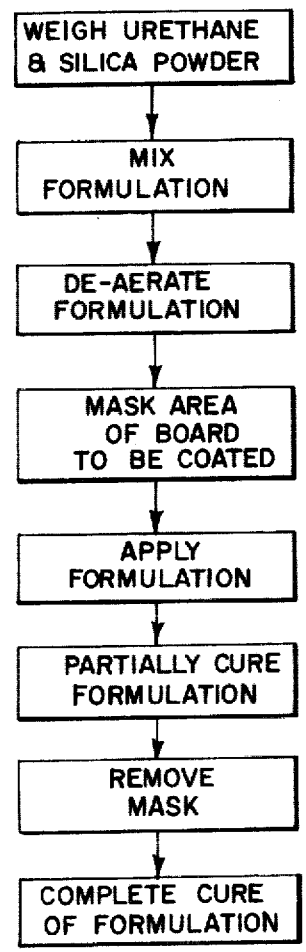
FIG. 4 is a simplified flow chart illustrating the steps in formulation and application of a conformal coating to circuit boards as in FIGS. 1-3.

In one practical method for implementing the present invention, a coating was formulated consisting of 40 parts by weight of urethane formulation which is commercially available under the trademark Uralane 8267, combined with 5 parts by weight of silica which is commercially available under the trademark Cab-O-Sil. The urethane formulation is received, stored and protected from any significant moisture. The silica is similarly stored and protected. Thus, the moisture free materials are then formulated in the following sequence, as summarized in the flow chart of FIG. 4.

1. 40 grams of the Uralane 8267 urethane were weighed into a 400 ml. (Milliliter) glass beaker mounted on a triple beam balance.
2. 5.0 grams Cab-O-Sil (Grade M-5) silica was added to the urethane in the glass beaker on the triple beam balance.
3. The formulation in the beaker was thoroughly mixed by vigorous stirring of the contents in the beaker.
4. Immediately following the thorough mixing, the coating mixture was deaerated under a reduced pressure using a pressure on the order of 20 mm. (millimeters) of mercury (Hg) or below. The deaeration is maintained for a period of approximately five (5) minutes. During the process of deaeration, the pressure reduction in the beaker is varied to break or disrupt air bubbles within the material and thereby ensure total release and removal of essentially all air from the material.

The mixture or formulation is then in condition for appropriate application as a coating.

It should be noted that during the formulation and particularly the weighing of the materials a disposable non-toxic particle mask should be worn, or other protection means used, by the personnel in the area to protect them from the dry silica dust.

To complete the application to a circuit board, the mounted circuit assembly is located within a relatively high humidity environment. Thus, urethane is a moisture-curing formation and for environmental curing, for example, the environment must have a humidity condition of not less than 30 percent relative humidity.

A satisfactory sequence which has been applied to the practical coating of the circuit board includes the following steps carried out in a normal laboratory room environment.

1. The completed circuit board is provided with a suitable confining dam defining the area to be coated. The dam, for example, may be formed by the application of a suitable flexible masking compound, or the like, which is readily commercially available.
2. An amount of the coating material or formulation is poured into the dam area, or otherwise applied to such area of the circuit board.
3. Where a quantity of material is poured onto the circuit board, a spatula or other suitable tool is used to guide the high viscosity formulation into the mass within the masked area. The coating flows to a relatively constant thickness, as a transparent coating over the circuit components including the circuit projections and asperities, for example as shown in FIG. 2.
4. The applied coating is allowed to cure, within the room environment if the humidity is at an appropriate level; that is, not less than 30% relative humidity. The high viscosity applied coating will partially cure within an 8 hour period to a sufficient level to permit removal of the masking compound as well as movement of the device.
5. Ultimate protection against adverse environmental conditions such as high humidity, temperature and particularly variations thereof, is created by allowing the coating circuit board to cure at room temperature for approximately 7 days. After such a period of time, full curing of the coating has occured and the maximum protection is established.

The coating formulation may be varied over a range in which the urethane is at least of 82.5 percent (%) of the formulation. Generally, the additive must be sufficient to prevent complete leveling of the coating while maintaining of the desired light transmitting characteristic. In addition another urethane formulation which has been used is sold by Conap, Inc. of 1405 Buffalo Street, Olean, New York 14760 under the trademark Conathane CE 1155. This is a two part material and requires the additional first mixing step.

If the room curing periods noted above are not acceptable accelerated curing by heating of the covered circuits may of course be provided. Thus, circuit boards with the conformal coating, such as disclosed above, have been heated at temperatures up to 160 F. for periods of from two hours to fifteen hours with satisfactory results.

Various modifications of coating formulation and its formation can thus be made within the teaching of the present invention which is directed to the combining of an electrically insulating coating material which drys to a transparent characteristic coating on the order of 0.5 mil and less than 2.0 mils on the outermost projections of a covered unit and which is compatible with small amounts of a highly divided powdered thickening agent to increase the viscosity of the coating so as to coat relatively sharp protrusions without adversely affecting the transparent characteristic of the coating. The urethane formulation and fumed silica coating formulation is a particularly practical implementation of the present invention. The other insulating materials which have a comparable or greater characteristic of adhering to the circuit board and the components, and particularly the terminal projections and the like, could of course be used. Similarly, a thickening agent having moisture resistance and light transmission characteristics at least comparable to the fumed silica as well as the same degree of fineness could be used. Further, the formulation may be made using any other suitable apparatus. The formulation may of course be applied by other means as well as cured in a special environment. The above method of making and applying the formulation has been satisfactorily used and is believed to provide a practical implementation of the invention.

Various modes in carrying out the invention are contemplated as being within the scope of the following claims, particularly pointing out and distinctly claiming the subject matter which is regarded as the invention.

I claim:

1. An electrical circuit assembly, comprising a base support with a plurality of electrical circuit components attached thereto and having circuit connections including conductive projections extending outwardly from the surface of the base support; a transparent coating of an insulating material applied to the base and covering circuit connections including said projections, said insulating material applied directly to the base and covering said circuit connections including said projections, said insulating material comprising a single component active insulating material which is essentially transparent and a minor portion of a thickening powder to maintain the electrical insulation of the covered components in a high humidity environment, said thickening powder being a powdered material having particles which are essentially submicron sized and establishing hydrogen bonding with said single component active insulating material.

2. The electrical circuit assembly of claim 1 wherein said support is a printed circuit board having printed conductive conductors and at least one electrical circuit component having wire terminals soldered to said conductive conductors and defining a pin-like projection from the surface of the board, said coating completely covering said pin-like projection.

3. An electrical circuit assembly subjected to a high humidity environment comprising a base support with a plurality of electrical circuit components attached thereto and having circuit connections including conductive projections extending outwardly from the surface of the base support, a transparent coating of an electrically insulating material applied directly to the base and directly covering said circuit connections including said projections, said coating comprising a predominant portion of a transparent urethane insulating material and an intimately mixed portion of a thickening agent of a fumed silica powder and establishing electrical insulation of the circuit components and said circuit connections including said projections in a high humidity environment.

4. The circuit assembly of claim 3 wherein said coating consists of substantially eight parts of a urethane formulation to one part of silica powder by weight.

5. The electrical circuit assembly of claim 3 wherein said support is a printed circuit board having printed conductive conductors and at least one electrical circuit component having wire terminals soldered to said conductive conductors and defining a pin-like projection from the surface of the board, said coating completely covering said pin-like projection, said coating consisting of at least 82.5 percent essentially pure urethane and a balance of fumed colloidal silica powder.

6. The electrical circuit assembly of claim 5, wherein said formulation is devoid of air bubbles.

* * * * *